Sept. 5, 1967 J. GRABMAIER ET AL 3,340,110
METHOD FOR PRODUCING SEMICONDUCTOR DEVICES
Original Filed Jan. 31, 1963
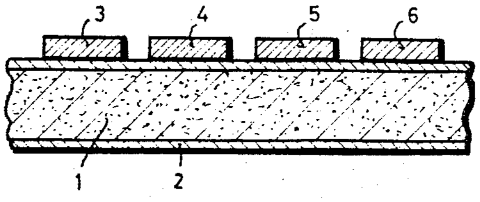

3,340,110

METHOD FOR PRODUCING SEMICONDUCTOR DEVICES

Josef Grabmaier and Erhard Sirtl, Munich, Germany, assignors to Siemens & Halske Aktiengesellschaft, Berlin and Munich, Germany, a corporation of Germany Continuation of application Ser. No. 255,739, Jan. 31, 1963. This application Jan. 21, 1966, Ser. No. 523,487
Claims priority, application Germany, Feb. 2, 1962, S 77,851
6 Claims. (Cl. 148—175)

This is a continuation of our application Ser. No. 255,739, filed Jan. 31, 1963 now abandoned.

Our invention relates to the production of electronic semiconductor devices by thermal dissociation of a gaseous compound of semiconductor substance and precipitation of the substance in monocrystalline form onto monocrystalline and preferably flat semiconductor members located on a heated support.

Such methods serve for producing successive monocrystalline semiconductor layers of respectively different conductance type and/or conductance magnitude. As a rule, the semiconductor discs, flat bodies or other members on which a layer of additional semiconductor substance is to be grown in this manner, is heated to the necessary high reaction temperature by heating the support upon which the member is placed. For example germanium or silicon epitaxial layers can thus be grown on monocrystalline discs of the same material from gaseous compound contained in the reaction gas.

To prevent contamination of the precipitated material by impurities stemming from the heated support, it has become known to use a supporting structure of the same highly pure semiconductor material as the semiconductor members that are to receive the precipitation. Thus, for epitaxial precipitation of silicon, there has been used a support of highly pure silicon consisting of a panel or of a longitudinally bisected and especially prepared rod. The preparation of such a support of silicon, to be simultaneously operable as a heater for the semiconductor members to be supported, is extremely difficult and costly. Using a support of the same semiconductor material as the supported discs has the further disadvantage that the thermally dissociated material also precipitates upon the support, so that the support can be employed only for a few processing runs before it must be exchanged or newly prepared for further use. At those places where during precipitation a semiconductor member was located, there remain recesses which during subsequent precipitation runs interfere with uniform heating of the supported semiconductor members and virtually make such uniform heating impossible after several precipitation runs. Non-uniform heating of the members, however, results in epitaxial layers of non-uniform thickness.

It is an object of our invention to eliminate such difficulties and faults heretofore encountered in semiconductor precipitation processes of the above-mentioned kind and to provide a way of accommodating the semiconductor members or conveniently heatable support structures that greatly minimize the tendency of precipitation occurring on the exposed surfaces of the supporting structure and permit being employed for a much larger number of successive operations.

To achieve these objects, and in accordance with a feature of our invention, we place the semiconductor members upon a material whose crystal lattice differs from that of the semiconductor members either as to lattice type or at least as to the lattice constant. It suffices if the difference in lattice constants amounts to a few percent, but at the processing temperature the support material must not form any mix-crystal (solid solution) with the material of the semiconductor members to be heated, nor a eutectic whose melting point is below that of the material of these members. According to another, more specific feature of our invention, the supporting structure for the semiconductor members consists, at least at its surface facing the semiconductor members, of a semiconductor material different from that of the semiconductor members in the just-mentioned sense, so as to form neither mix crystals nor a eutectic having a melting point below that of the semiconductor members. Thus, silicon can be used according to the invention as supporting material for epitaxial growth of germanium layers on monocrystalline semiconductor members. Preferably employed, however, is silicon carbide for supporting semiconductor members of germanium or silicon.

When employing a supporting structure according to the invention, virtually no precipitation of the semiconductor substance from the gaseous phase onto the support takes place, or any such precipitation will scale off during cooling of the support for lack of intimate bonding to the support, or can easily be removed after cooling with the aid of a scrapper, for example of silicon or silicon carbide.

The material for the supporting structure must also meet the requirement that it can be brought into a shape suitable for accommodating the semiconductor members and securing a uniform heat transfer from the support to the members. The support material must also be heatable electrically, for example by induction and, particularly, by directly passing electric current through the support. It is, of course, also a prerequisite that the material can be produced in sufficiently pure form, and its melting point must be high in comparison with that of the semiconductor members to be supported.

The above-mentioned use of semiconductor materials for the supporting structure meets all of these requirements. Such materials can be produced with an especially high degree of purity. For example, a supporting structure of silicon for epitaxial precipitation of germanium from the gaseous phase onto semiconductor discs of germanium, can be employed very often, such as up to fifty times, without any intermediate treatment. Furthermore, any depositions of germanium that may form on the support after numerous precipitation runs, is very easily removed, for example mechanically or by etching. The same applies to supporting structures of silicon carbide when used for epitaxial precipitation of silicon or germanium.

It is not necessary to have the entire support consist of the semiconductor material but suffices to use a support coated with the semiconductor material. This affords simplifying and improving the heating of the support by directly passing current through its core material or by means of induction heating. Of particular advantage, according to a more specific feature of our invention, is a support consisting of a heater made of graphite or the like carbon material and coated with silicon or silicon carbide. When using a support entirely of highly pure semiconductor material, difficulties are encountered and auxiliary circuitry is needed when heating the support from room temperature to the required incandescent reaction temperature by internal electric current directly passing through the support or generated therein by induction. This is because the electric conductance of hyperpure semiconductor material at low temperature is extremely slight. However, by composing the support of an inner core body consisting of a heating element made of graphite or the like, and a surface coating of hyperpure silicon or silicon carbide, no such difficulties are encountered.

It has been found that when the reaction gas mixture contains a hydrogen-halogen compound admixed to the gaseous semiconductor compound, a precipitation of semiconductor substance will also take place on the side of the semiconductor member contacting the support, particularly at very high reaction temperatures. Such a hydrogen-halogen compound may be present in the reaction mixture supplied to the reaction vessel, or it may be formed as a reaction product, during thermal dissociation, from the hydrogen-halogen compound if the gaseous semiconductor compound being used is a halogen compound. Such formation of a hydrogen-halogen compound is due to reaction of the halogen liberated by the dissociation process with the hydrogen of the carrier gas. For example, when germanium discs, under such circumstances, are placed upon a heated support for silicon in order to receive an epitaxial growth of germanium, such growth will occur not only on the exposed surface of the disc but also on its bottom side seated on the support. This phenomenon is due to a transport reaction occurring in the interspace between the semiconductor disc and the support. The halogen hydride causes elimination of silicon from the support under formation of a subhalogenide which becomes dissociated at localities of lower temperature and hence on the bottom side of the supported disc under formation of silicon. Such a precipitation of silicon, which is appreciable at the higher temperatures within the range of operating temperatures, is not always desired so that the layer thus precipitating upon the discs must be subsequently removed.

However, the precipitation on the bottom side of the discs in the presence of halogen hydride can be avoided according to another, preferred feature of our invention, by employing a support material not subject to attack by the reaction gas mixture at the operating temperature of the process. Such a resistance of the supporting material to attack by the reaction gas is particularly well secured when employing supporting structure of silicon carbide or coated with silicon carbide. Silicon carbide is producible as a homogeneous substance, as well as a coating, with a high degree of purity and, due to its high chemical resistance and high melting point, satisfies to a particularly great extent all above-mentioned qualities desired of the support. A support of silicon carbide is also applicable to advantage in the epitaxial precipitation of intermetallic semiconductor compounds, for example $A^{III}B^{V}$ semiconductors.

For producing such a silicon carbide coating on a body of graphite. a gaseous halogen compound of silicon, preferably mixed with a carrier gas such as hydrogen, is contacted with the graphite body while the latter is kept at a temperature of about 1300° C. or more, whereby the reaction gas is thermally dissociated under formation of precipitating silicon carbide.

One way of performing this method is to heat the graphite body in a halogen silane atmosphere, for example in trichlorsilane ($SiHCl_3$), to about 1300° C. This causes pyrolytic dissociation of the silicon compound and precipitation of the evolving silicon onto the graphite body where the silicon forms with the carbon of the support a thin surface coating of silicon carbide.

A silicon carbide coating can also be directly precipitated upon a graphite heater rod or core by the following method. Preferably used is an organosilicon compound, namely a compound of silicon and carbon. The liquid silicon carbon compound is contained in an evaporator in which the carrier gas, for example hydrogen or argon, is passed over the level of the liquid. The compound-laden gas is then passed into the processing chamber proper in which the graphite heater is mounted and electrically heated to the pyrolytic temperature. It is preferable to make certain that the temperature of the heater will not drop below 1300° C. during pyrolysis because otherwise elemental silicon may precipitate together with silicon carbides. Organosilicon compounds suitable for this process are $CH_3SiHCl_2$, $CH_3SiCl_3$ or $(CH_3)_2SiCl_2$, for example. The flow velocity of the carrier gas (hydrogen or argon) in all of these cases may be kept at about 50 liters per hour. The carrier gas may be charged up to about 10% with the gaseous compound.

Also applicable for pyrolytic production of a silicon carbide coating is a reaction-gas mixture consisting of a halogen-carbon-hydrogen compound and a halogen compound of silicon. A suitable mixture of this kind contains, for example, 3 volumetric percent $CHCl_3$ and 7 volumetric percent $SiHCl_3$, besides hydrogen which serves as a carrier gas. The mixture is passed along a graphite body heated to 1300° C., at a flow velocity of the hydrogen of approximately 30 liter per hour.

All of the above-described pyrolytic methods result in forming on the carbon or graphite heater a highly resistant, gray-glossy coating of pure silicon carbide. The semiconductor discs or other members placed upon such a support during the epitaxial crystal growing process preserve their highly brilliant surface even at the higher temperatures within the applicable range.

The accompanying drawing shows by way of example a supporting structure according ot the invention together with supported semiconductor discs for epitaxial precipitation.

The supporting body 1 consists of highly pure graphite coated with a highly resistant coating 2 of silicon carbide. Placed upon the flat top surface of the support are the semiconductor members, for example of germanium or silicon, here consisting of circular discs. Four such discs are illustrated and denoted by 3 to 6. The support with the discs is arranged in a reaction vessel (not shown) and provided with current supply means that extend through the reaction vessel to the outside where they are connected to a voltage source. During performance of the method, the reaction gas passes through the vessel and along the supported discs. The reaction gas consists of a mixture of the semiconductor compound to be dissociated, for example germanium tetrachloride or silicochloroform, and a carrier gas such as hydrogen. While the reaction gas passes through the vessel, the support 1 is heated by passing current therethrough, thus maintaining the support at the pyrolytic reaction temperature, for example of about 1000 to 1200° C. for silicon. As a result, the semiconductor substance is precipitated from the reaction gas in form of a monocrystalline layer upon the monocrystalline discs. For producing several layers of respectively different doping, corresponding doping substances or dopant quantities are added to the reaction gas in the known manner while the respective layers are being precipitated. Any precipitation upon the surface of the supporting structure can easily be removed by immersion in an etching solution, but such precipitation becomes appreciable or possibly disturbing only after completion of numerous precipitation processes. During any such cleaning of the support, the silicon carbide coating remains undamaged because of its high chemical resistance.

We claim:

1. Process of growing epitaxial layers of semiconductor material on a monocrystalline semiconductor body, which comprises performing in a reaction vessel the steps of heating a structure of carbon having a top flat surface to a temperature of about 1300° C. in the presence of a gaseous compound of silicon selected from the group consisting of a halogen and hydrogen compound of silicon and an organosilicon compound so that the gaseous compound reacts with the carbon to form a dense layer of silicon carbide on the surface; placing the semiconductor body on the silicon carbide-coated surface, heating the semiconductor body to a temperature at which a given gaseous compound of the semicodnuctor material is pyrolytically decomposed by heat conduction from the coated structure, contacting the heated semiconductor body with the given gaseous compound mixed with a carrier gas and heating the gaseous compound to the temperature at which it is pyrolytically decomposed so that a layer of the semiconductor material is epitaxially grown on the semiconductor body, removing the epitaxially coated semiconductor body from the structure, and cleansing the silicon carbide-coated surface of the structure from the semiconductor material deposited thereon preparatory to placing another semiconductor body thereon and repeating the step whereby a layer of semiconductor material is epitaxially grown on the semiconductor body.

2. Process according to claim 1 wherein the structure is heated by induction.

3. Process according to claim 1 wherein the structure is heated by passing an electric current therethrough.

4. Process according to claim 1 wherein the silicon carbide-coated surface is mechanically cleansed.

5. Process according to claim 1 wherein the silicon carbide-coated surface is chemically cleansed.

6. Process according to claim 1 wherein the silicon carbide-coated surface is cleansed by heating the structure in the presence of a reaction gas enriched with halogen and hydrogen so that the semiconductor material deposited on the silicon carbide-coated surface forms a volatile compound of the semiconductor material whereas the silicon carbide coating remains unaffected.

References Cited

UNITED STATES PATENTS

| | | | |
|---|---|---|---|
| 876,331 | 1/1908 | Clark et al. | 117—228 |
| 876,332 | 1/1908 | Clark et al. | 117—228 |
| 1,013,700 | 1/1912 | Tone | 23—208 |
| 1,044,295 | 11/1912 | Tone | 23—208 |
| 1,948,382 | 2/1934 | Johnson | 117—228 |
| 2,692,839 | 10/1954 | Christensen et al. | 148—175 |
| 2,802,759 | 8/1957 | Moles | 148—174 |
| 2,929,741 | 3/1960 | Steinberg | 23—208 |
| 2,992,127 | 7/1961 | Jones | 117—228 |
| 3,019,128 | 1/1962 | Smiley | 117—228 |
| 3,042,494 | 7/1962 | Gutsche | 148—174 |
| 3,147,159 | 9/1964 | Lowe | 23—208 |
| 3,151,006 | 9/1964 | Grabmaier et al. | 148—175 |
| 3,168,422 | 2/1965 | Allegretti et al. | 148—175 |

DAVID L. RECK, *Primary Examiner.*

N. F. MARKVA, *Assistant Examiner.*